United States Patent [19]
Werrbach

[11] Patent Number: 5,422,602
[45] Date of Patent: Jun. 6, 1995

[54] FREQUENCY DISCRIMINATE LEVELER

[75] Inventor: Donn Werrbach, Glendale, Calif.

[73] Assignee: Aphex Systems, Ltd., Sun Valley, Calif.

[21] Appl. No.: 262,266

[22] Filed: Jun. 20, 1994

[51] Int. Cl.6 .............................................. H03G 3/30
[52] U.S. Cl. ................................... 330/281; 330/141; 381/107
[58] Field of Search ................ 330/141, 281; 381/106, 381/107, 108; 455/244.1

[56] References Cited
U.S. PATENT DOCUMENTS

| | | | |
|---|---|---|---|
| 3,408,588 | 10/1968 | Rugo | 330/141 X |
| 3,904,971 | 9/1975 | Delagrange | 330/141 X |
| 4,718,099 | 1/1988 | Hotvet | 381/107 X |

*Primary Examiner*—James B. Mullins
*Attorney, Agent, or Firm*—Thomas I. Rozsa; Tony D. Chen

[57] ABSTRACT

A frequency discriminate leveler ("FDL") which controls its attack rate depending on the audio frequency to more perfectly preserve the natural sound of the audio program while very effectively controlling the long term average program level. The FDL has a function to attack more slowly for low frequency signals than for high frequency signals. The FDL includes a gain controller, an FDL control generator and a leveling detector. The gain controller coupled to an input signal and an output signal. The input signal is the unleveled audio program which can vary widely in average level. The output signal is the leveled signal which contains a more constant average level. The FDL control generator generates a suitable control output to cause the gain controller to increase or decrease gain. The FDL control generator is coupled to the leveling detector for the purpose of receiving the output of the leveling detector, and generating a control output to control the gain of the gain controller. The leveling detector receives a sample input and generates a detected output signal coupled to the input of the FDL control generator.

13 Claims, 4 Drawing Sheets

FREQUENCY DISCRIMINATE LEVELER

BACKGROUND OF THE INVENTION

1. Field of the Invention

The present invention relates to the field of audio signal processing systems. More particularly, the present invention relates to the field of automatic gain controllers.

2. Description of the Prior Art

In broadcasting and recording it is often desirable to use a device which can function as an automatic level controller. The function of such a device is to maintain the outgoing signal reasonably close to the reference level even though the incoming signal may vary over a wide range of levels. The advantages of using such a device depend on the type of application, but generally the advantages are improved listenability of a string of programming elements such as music selections, announcements, and commercials. Also, in recording, vocal tracks and submixes can sometimes be better mixed into the final cut if automatic level control is used for the separate tracks.

Automatic level controllers (hereafter referred to as "the leveler") are usually referred to as "AGC" which represents automatic gain controllers. An ideal leveler would take a wide range of input audio levels and produce at the output a well regulated level which remains, on the long term average (i.e. based on a 10 second or longer average), near the specified reference level. An ideal leveler would also allow the shorter term dynamics of the sound to remain natural without compression or limiting effects due to the leveling action. An ideal leveler would further perform its function without being obvious to a listener. In other words, a leveler should keep the sound very natural, but at a consistent audio level. It is not necessarily obvious or simple to accomplish the above objectives, since the ear is usually very sensitive to the effects of dynamic range compression.

There are a number of products on the market called levelers which have a selectable function called leveling. Typically, these levelers do not closely meet all of the above described ideal levelers. Therefore, it would be desirable to create a new leveler which would more closely resemble the above described ideal levelers and which is both easy to use and low in cost.

SUMMARY OF THE INVENTION

The present invention is a frequency discriminate leveler (hereafter referred as "FDL") which controls its attack rate depending on the audio frequency to more perfectly preserve the natural sound of the audio program while very effectively controlling the long term average program level. The genesis of the present invention was an intuitive discovery that bass frequencies in sound, i.e., frequencies below approximately 200 hertz, are sensed differently by the human ear than the higher frequencies, and that the human ear more readily detects an attenuation of the initial bass wave front than attenuation of higher frequency wave fronts.

It has been discovered, according to the present invention, that simply slowing down the attack time of a leveler does not fully satisfy the human ear with regard to preserving natural sound because the human ear seems to build a reference between bass and higher frequencies in the time domain. Therefore, it is an object of the present invention to make the attack for bass frequencies slower than that for higher frequencies so that the human ear could be satisfied that the leveled bass sounds were relatively unmodified. In other words, it appears that the perception of "power" or "punch" of bass frequencies is a dynamic function of hearing involving both frequency and time domains. This is a significant discovery which, along with specific circuit innovations to adapt this discovery to a leveler, lends to the novelty and usefulness of the present invention.

The present invention FDL includes a means to attack more slowly for low frequency signals than for high frequency signals. The demarcation between "low frequency" and "high frequency" signals as it applies to the present invention is not explicitly specified. However, by way of example only and without limiting the present invention, the low frequencies would typically include all frequencies below 400 hertz, and the high frequencies being the remainder of the audio spectrum.

Describe generally, the present invention FDL includes three essential elements: a gain controller, an FDL control generator and a leveling detector. The gain controller is coupled to an input signal and an output signal. The input signal is an unleveled audio program which can vary widely in an average level. The output signal is the leveled signal which contains a more constant average level. The FDL control generator generates a suitable control output to cause the gain controller to increase or decrease in gain. The FDL control generator is coupled to the leveling detector for the purpose of receiving the output of the leveling detector, and generating a control output to control the gain of the gain controller. The leveling detector receives a sample input and generates a detected output signal which is coupled to the input of the FDL control generator.

The sample input can be either the input signal or the output signal of the gain controller. In the former case, the present invention would be classified as a feedforward FDL, and in the latter case it would be classified as a feedback FDL. The teachings of the present invention apply equally to both categories of FDL, although the preferred embodiment is in the form of a feedback FDL.

The novelty of the present invention is particularly a method, i.e., the frequency discriminate leveling relating to a newly discovered psychoacoustic effect of bass leveling auditory perception, and in the unique embodiment circuitry which was developed to implement the method.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
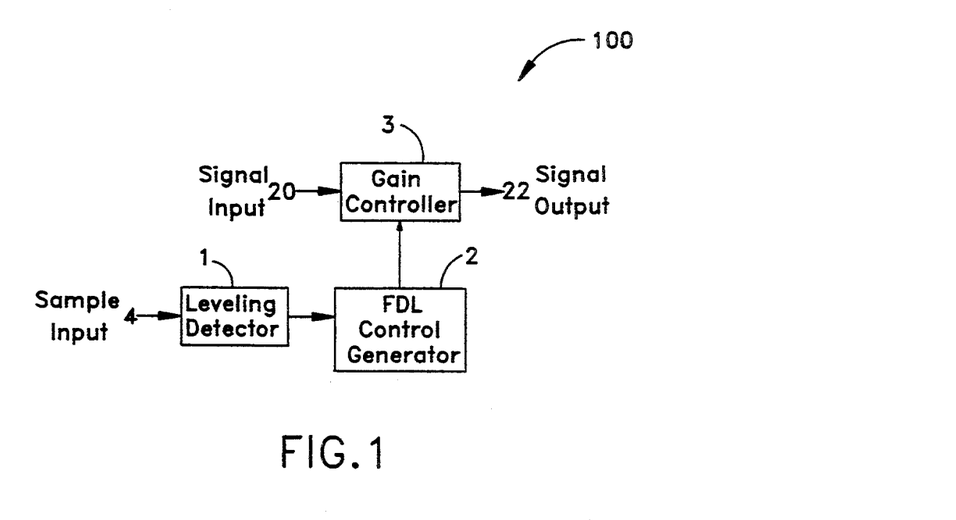
FIG. 1 is a simplified block diagram of the present invention frequency discriminate leveler.

Referring to FIG. 1, there is illustrated at 100 a simplified functional block diagram of the present invention. The present invention FDL includes a gain controller 3, an FDL control generator 2, and leveling detector 1. The gain controller 3 is coupled to an input signal 20 and an output signal 22. The input signal 20 is the unleveled audio program which can vary widely in an average level. The output signal 22 is the leveled signal which contains a more constant average level. The FDL control generator 2 generates a suitable control output to cause the gain controller 3 to increase or decrease in gain. The FDL control generator 2 is coupled to the leveling detector 1 for the purpose of receiving the output of the leveling detector 1, and generating a control output to control the gain of gain controller 3. The leveling detector 1 receives a sample input 4 and generates a detected output signal which is coupled to the input of the FDL control generator 2.

The sample input 4 can be either the input signal 20 or the output signal 22 of the gain controller 3. In the former case, the present invention would be classified as a feedforward FDL, and in the latter case it would be classified as a feedback FDL. The teachings of the present invention apply equally to both categories of FDL 100, although the preferred embodiment is in the form of a feedback FDL as will be further described below.

Figure 2:
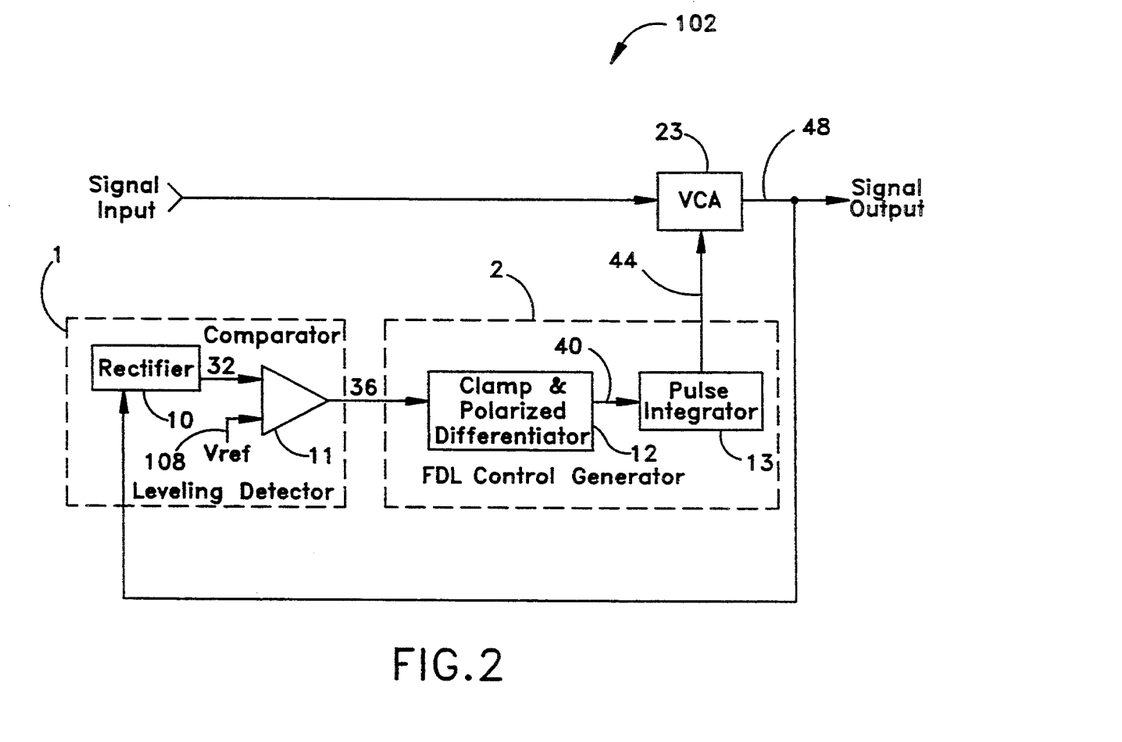
FIG. 2 is a functional block diagram of the preferred embodiment of the present invention frequency discriminate leveler.

Referring to FIG. 2, there is illustrated at 102 a functional block diagram of the preferred embodiment of the present invention. In the preferred embodiment, the present invention feedback FDL 102 includes five essential elements: a voltage controlled amplifier 23 (VCA), a rectifier 10, a comparator 11, a clamp & polarized differentiator 12 (CPD), and a pulse integrator 13. The present invention as depicted in FIG. 1 and previously described, can be superimposed on FIG. 2 in the following way. The gain controller 3 of FIG. 1 is the same as the VCA 23. The leveling detector 1 of FIG. 1 is the same as the rectifier 10 and comparator 11 shown within the dashed lines of the leveling detector 1. The FDL control generator 2 of FIG. 1 is the same as the CPD 12 and pulse integrator 13 shown within the dashed lines of the FDL control generator 2. The sample input 4 of the leveling detector 1 of FIG. 1 is the same as the input of rectifier 10 coupled to the output signal of VCA 23.

The functioning of the block diagram of FIG. 2 can be described as follows. An unleveled input signal is coupled to the input of the VCA 23 for the purpose of controlling the level of the unleveled input signal. The VCA output signal 48 is the leveled signal output. The VCA output signal 48 is coupled to the rectifier 10 of the leveling detector 1 for the purpose of supplying a sample signal to the leveling detector 1. The output 32 of rectifier 10 is coupled to one of the inputs of the comparator 11. The other input of comparator 11 is coupled to a reference voltage source Vref 108. While the magnitude of the rectifier output 32 is below the magnitude of Vref 108, the output 36 of comparator 11 is said to be "off". While the magnitude of the rectifier output 32 is above the magnitude of Vref 108, the output 36 of comparator 11 switches states and is said to be "on". When audio signals are present at the signal input, it would be normal to see a pulse train emanating from the comparator output 36. The pulse train from comparator 11 is coupled to the clamp & polarized differentiator ("CPD") 12 of the FDL control generator 2. The CPD 12 serves to modify the shape of the "on" pulses which it receives from the comparator 11 as a function of pulse "on" period. The way the pulses are modified by the CPD 12 will later be described. The reshaped pulses from the CPD 12 are coupled to the pulse integrator 13 for the purpose of converting the pulses into a D.C. voltage. The pulse integrator 13 produces a variable output voltage which is dependent upon the pulse shape and duration of the modified pulse train of the CPD 12. The output 44 of the pulse integrator 13 is coupled to the control input of the VCA 23 in a manner such that an increasing output voltage from the pulse integrator 13 causes increasing gain reduction of the VCA 23.

The effect of the CPD 12 will now be described. The pulses from the output 36 of comparator 11 are essentially rectangular shaped. The relative duty cycle of the "on" state depends on how high the VCA output 48 is, and therefore how high the rectifier output 32 is relative to the magnitude of Vref 108. If the rectifier output 32 is much higher than Vref 108, then the comparator output 36 would have a high duty cycle. If the rectifier output 32 is only slightly greater than the magnitude of Vref 108, then the comparator output 36 duty cycle will be low.

For the purpose of illustration, if the comparator output pulses 36 were directly coupled to the input of pulse integrator 13, and the CPD 12 were absent, then a useful prior art leveler would be created. In such case, the pulse integrator 13 would create an output voltage linearly proportional to the comparator 11 pulse train duty cycle without regard for the pulse frequency. The rate of rise and fall of the pulse integrator output voltage 44 would be primarily a function of the comparator output pulse amplitude and secondarily a function of the pulse duty cycle. A servoing action would take place which causes the VCA 23 to attenuate or disattenuate until the average magnitude of the rectifier output 32 equals the magnitude of Vref 108.

The addition of the function of the CPD 12 makes the rate of rise of the pulse integrator output voltage 44 also a function of the pulse frequency in a manner which complies with the teachings of the present invention. The CPD 12 causes the FDL 102 to be frequency dependent by modifying the shape of the output pulses of comparator 11 in the following way.

Figure 5:
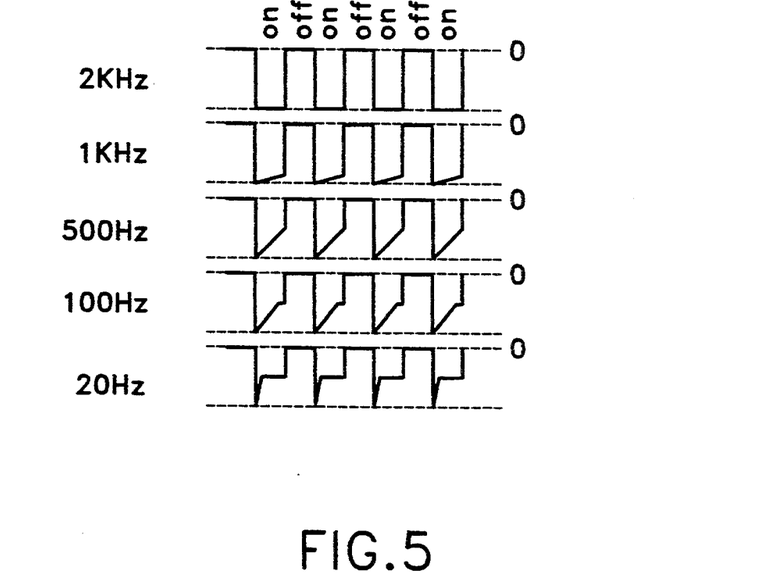
FIG. 5 is an illustrative diagram showing the modified comparator waveforms of the present invention.

Referring to FIG. 5, there is illustrated a group of pulse trains which have been modified by the CPD 12. The details of FIG. 5 are simplified examples for illustration only and in no way limit the present invention to the specific waveforms or frequencies shown. Each pulse train is labeled with a representative pulse frequency. What is illustrated is a representation of how the pulses are modified in shape to cause a reduction of effective "on" area for the lower frequencies by differentiating only the greater amplitude half of the pulses' "on" amplitude. In other words, below a certain frequency (shown here by example only) such as 2 kilohertz, and to a greater extent as the pulse frequency decreases, the greater amplitude half of the "on" pulses are converted into spikes. This causes the relative pulse "on" area to become increasingly less as the pulse frequency is decreased. The effect of this pulse shaping on the rate of charge of the pulse integrator 110 is shown in FIG. 6b.

Figure 6A:
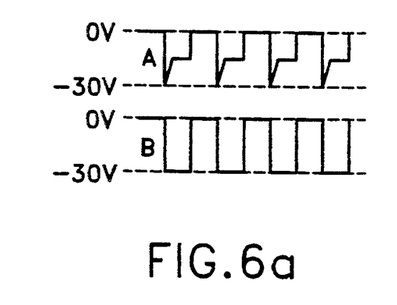
FIG. 6a is an illustrative diagram showing how the modified comparator waveforms of FIG. 5 cause a frequency dependent attack time of the FDL.

Referring to FIG. 6a, there is illustrated how the preferred embodiment uses shaped pulses to control the rate of charge of the pulse integrator. The information in FIGS. 6a through 6c depict waveforms and other parameters. It will be appreciated that any specific details shown are for the purposes of illustrating certain aspects of the preferred embodiment of the present invention only and the scope of the present invention is not limited to the specific details shown.

Figure 6B:
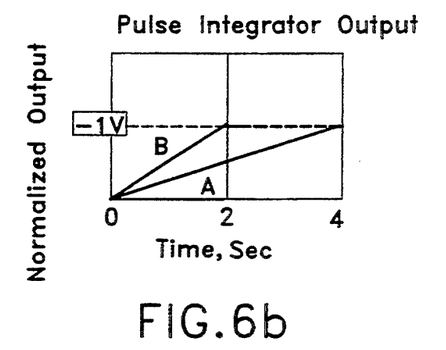
FIG. 6b is an illustrative diagram showing two output curves of the pulse integrator shown in FIG. 6c.
Figure 6C:
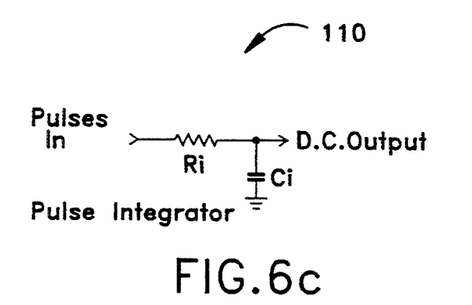
FIG. 6c is a simplified schematic version of the pulse integrator of the present invention.

Referring to FIG. 6b, there are shown two sets of pulse trains which are labeled A and B. The pulse train B is a relatively high frequency pulse train which, as shown in FIG. 6a, remains rectangular in shape. The pulse train A is a relatively low pulse frequency which is significantly modified by the effects of the CPD 12.

Figure 4:
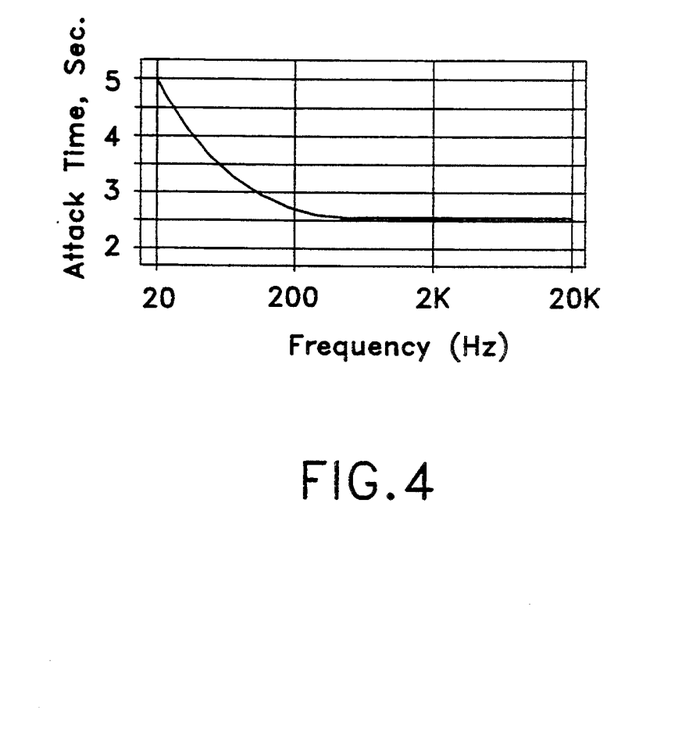
FIG. 4 is an illustrative diagram showing an attack time response curve of the present invention as a function of frequency.

Referring to FIG. 6c, there is illustrated a pulse integrator 110 which represents generally the pulse integrator of the preferred embodiment, but is not explicitly detailed in FIG. 6c other than to show it is composed of a capacitor Ci and a resistor Ri. It will be assumed that the time constant of the pulse integrator 110 is long enough to allow smooth integration of the lowest pulse frequency, i.e., on the order of one second. The pulse integrator output graph of FIG. 6b shows how the pulse integrator 110 charges up from a zero charge condition when pulse trains A and B are applied to the pulse integrator input. The curve B represents the effect of applying pulse train B, and likewise curve A represents the effect of applying pulse train A. When pulse train B is applied, the pulse integrator output voltage rises to the reference level −1 V in about two (2) seconds. When pulse train A is applied, however, the rate of charge takes about twice as long. This is directly a result of the fact that the "on" area of pulse train A is only about half as much as that of train B. Therefore, the lower frequency pulse train caused a slower charging of the pulse integrator 110. For intermediate pulse frequencies between the frequencies of the pulse trains A and B, the pulse integrator 110 charge-up time would approximately follow the curve of FIG. 4.

The combination of all aforementioned functions of FIG. 2 creates a feedback frequency discriminate leveler (FDL) 102 of the present invention in the following way. An unleveled audio signal is supplied to the FDL 102 at the Signal Input. The signal output 48 of the VCA 23 is coupled to the leveling detector 1. The leveling detector 1 produces a rectangular shaped pulse train output from the comparator 11 which has an "on" duty cycle dependent on the magnitude of the VCA output signal 48 compared to a reference level. The pulse train of the leveling detector 1 is received by the FDL control generator 2. The FDL control generator 2 converts the pulse train from comparator 11 into a control voltage having a slower rate of rise for relatively low frequencies and a higher rate of rise for relatively high frequencies. By a servo action of the level detector-control generator-VCA loop, the VCA 23 continually adjusts its gain until the average level of the VCA output signal 48 equals the reference level. The rate that the VCA 23 can decrease its gain is called the "attack" rate of the leveler, which is by action of the FDL control generator 2 slower for bass frequencies than for the higher frequencies.

Figure 3:
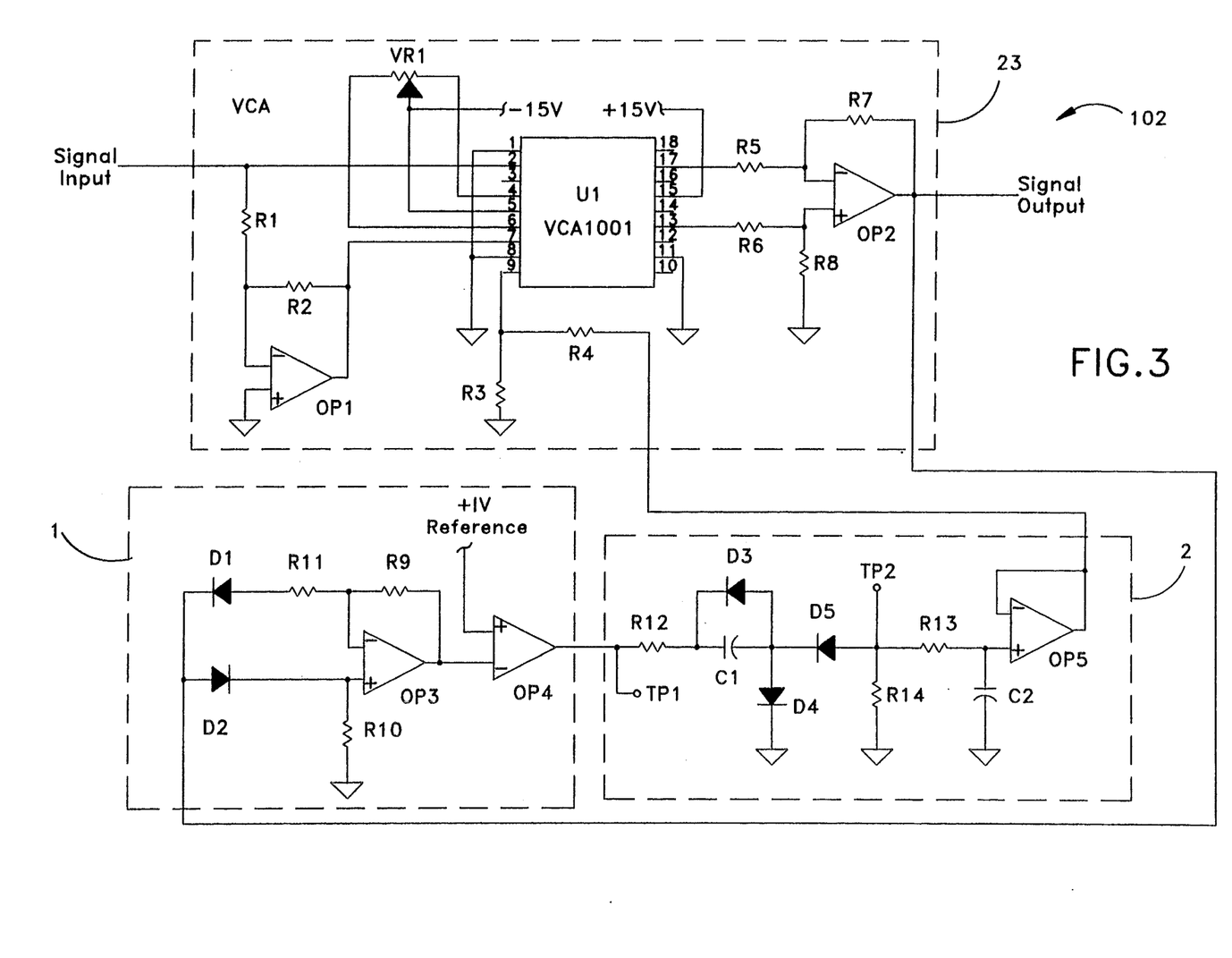
FIG. 3 is a detailed circuitry diagram of the preferred embodiment of the present invention frequency discriminate leveler.

Referring to FIG. 3, there is illustrated a working circuit schematic of the preferred embodiment of the present invention. It will be appreciated that the circuit is but one of many circuits which could be devised to create a frequency dependent leveler of the present invention, and the present invention is not limited to only this embodiment. It is also within the spirit and scope of the present invention to have a multiplicity of circuits designed for the present invention. The circuit can be easily constructed from common parts and serves well to illustrate the teachings of the present invention. The block diagram of FIG. 2 corresponds closely to the circuit of FIG. 3 as will be noted throughout the forthcoming description of the circuit.

The VCA 23 of FIG. 2 is created in FIG. 3 by the parts enclosed by the dash lines box 23. By way of example only, resistors R1 and R2 may be 10KΩ, and R7 and R8 may be 33KΩ. By way of example only, resistors R4 and R5 may be 4.99KΩ. By way of example only, differential amplifiers Op1 and Op2 are type LF351 opamps. By way of example only, resistor R3 may be 21.5Ω, and resistor R4 may be 1KΩ. By way of example only, variable resistor VR1 is a 1KΩ single turn trimmer potentiometer. Chip U1 is a high performance VCA integrated circuit type VCA1001 available from Aphex Systems Ltd. The VCA circuit description is as follows. Op1 with R1 and R2 form a phase inverter to invert the polarity of the input signal. The direct and inverted input signals are applied to the two VCA1001 inputs at pins 2 and 7, respectively. The two outputs of the VCA1001 chip at pins 13 and 17 are differenced by the differential amplifier of Op2 with resistors R5, R6, R7, and R8. The output of the differential amplifier is the VCA output signal. VR1 is used to minimize the control feedthrough of the VCA1001 chip, and is typically adjusted by applying a swept control voltage to the VCA1001 with no audio signals present, and trimming for the minimum signal at the VCA output. Resistors R3 and R4 form a voltage divider to hold the impedance at the VCA control at pin 9 at a low resistance and allow a useful scale factor to be set for the VCA gain control voltage. The VCA gain control voltage is applied to resistor R4.

The leveling detector 1 of FIG. 2 is created in the circuit of FIG. 3 by the parts enclosed by the dash lines box 1. Differential amplifier Op3 with diodes D1 and D2, and resistors R9 through R11 create the rectifier of FIG. 2. Differential amplifier Op4 is used as the comparator 11 of FIG. 2. The +1 V reference of FIG. 3 is used as the Vref of FIG. 2.

The FDL control generator 2 of FIG. 2 is created by the circuit of FIG. 3 by the parts enclosed by the dash lines box 2. Differential amplifier Op5 is coupled to resistor R4, and resistor R13 and capacitor C2 serve only as a voltage buffer to drive the VCA control input. The clamp & polarized differentiator 12 of FIG. 2 is comprised in FIG. 3 of resistors R12 and R14, diodes D3, D4 and D5, and capacitor C1. The pulse integrator 13 of FIG. 2 is comprised in FIG. 3 of resistor R13 and capacitor C2. By way of example only, resistor R12 may be 499Ω, all diodes are type 1N914B, capacitor C1 may be 0.22 μF, resistor R14 may be 10KΩ, resistor R13 may be 10MΩ, and capacitor C2 may be 1 μF.

The VCA circuit 23 is coupled to an input signal and an output signal, and receives a gain control voltage from Op5. The VCA circuit 23 can thus be given a gain or loss by a suitable control voltage from Op5. The VCA output signal is coupled to the rectifier through diodes D1 and D2. The rectifier circuit 1 outputs from Op3 a full wave rectified signal of positive voltage polarity with an amplitude equal to the VCA output signal amplitude. The comparator Op4 receives the rectified signal at its negative (−) input and receives a positive 1 V reference voltage at its positive (+) input. The output of the comparator Op4 remains at approximately positive 13 volts while the rectifier output signal is below 1 volt and switches to negative 13 volts while the rectifier output signal is above 1 volt. A pulse train is thus produced from the comparator whenever a large enough VCA output signal is present to activate the comparator Op4. This could be assumed to be most of the time. The rectangular shaped pulse train from the comparator Op4 is observable at test point 1 (TP1). A typical waveform at TP1 might look like the waveform of FIG. 7a when an audio program is present at the VCA signal input.

While the voltage seen at TP1 resides at +13 volts, (i.e., while the comparator output pulses are in the "off" state), capacitor C1 very quickly charges up to +13 volts through resistor R12 and the forward biased clamp diode D4. At this time, D5 is reverse biased, and removes R14, R13 and C2 from any voltages present at the node D3, D4, and C1. Also at this time the voltage at test point 2 (TP2) will be close to zero volts and any accumulated charge on C2 will be slowly discharging toward zero volts through the circuit of R13 and R14. At this time diode D3 is reverse biased and has no function.

When the voltage at TP1 is residing at −13 volts (i.e., when the comparator pulses are in the "on" state), the −13 volt charge on capacitor C1 is such a polarity as to hold diode D3 reverse biased. The −13 volts charge of C1 adds to the comparator output voltage of −13 volts so the net voltage at the node of D3, D4, and C1 is about −26 volts. Diode D4 is reverse biased and now has no effect in the circuit. Diode D5 conducts the −26 volts to the node of TP2. Therefore, a pulse amplitude of zero to negative 26 volts is present at the node of TP2. The charge which was accumulated on capacitor C1 now discharges through the forward biased diode D5 and resistor R14. If the duration of the comparator output pulse remains in the "on" state for a long enough time representing that the pulse frequency is relatively low, the charge of capacitor C1 will discharge sufficiently to allow the pulse amplitude at TP2 to ramp down towards zero volts causing the pulse shape modifications typified in FIG. 5. The down ramping of the pulse amplitude is halted at 50 percent amplitude by the fact that diode D3 eventually becomes forward biased when the voltage charge of capacitor C1 nears zero volts. Diode D3 then conducts the comparator's output voltage of −13 volts into diode D5 and onward to TP2.

Figure 7A:
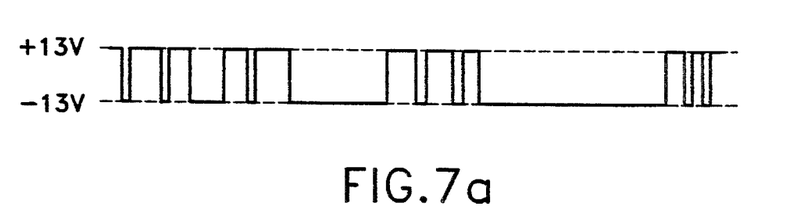
FIG. 7a is an illustrative diagram showing a typical waveform seen at TP1 of FIG. 3.
Figure 7B:
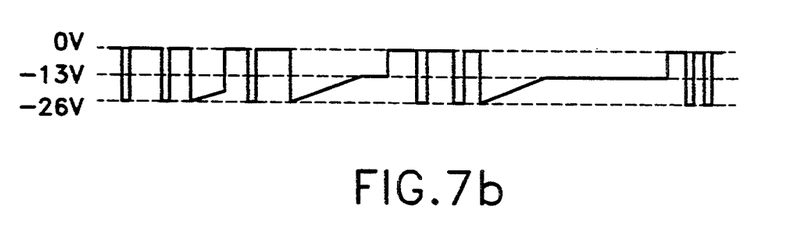
FIG. 7b is an illustrative diagram showing a typical waveform seen at TP2 of FIG. 3.

FIG. 7b shows how the waveform of FIG. 7a and TP1 might look at TP2 as a result of the circuit action just described. The circuit responsible for the described pulse ramping effect can be called a polarized differentiator, as in FIG. 2, since pulse differentiation by capacitor C1 is technically responsible for the ramping effect and takes place only on one polarity of the pulse train.

The combination of resistor R13 and capacitor C2 act as a pulse integrator integrating the pulses seen at TP2 in a manner which was already described and illustrated in FIG. 6c. The resulting voltage charge of capacitor C2 is a negative voltage which can vary from zero to about negative 2 volts over the practical signal leveling range of the circuit. The integrator voltage is buffered by the high impedance voltage buffer of Op5. The Op5 output voltage is coupled to the VCA control input of R4 to control the VCA gain. A greater negative control voltage from Op5 causes greater VCA attenuation of gain. Therefore, a frequency discriminate leveler is created.

It will be appreciated that all numerical values given above are merely for illustrative purposes and can include many other numerical values.

Defined in detail, the present invention is a frequency discriminate leveler (FDL), comprising: (a) a voltage controlled amplifier (VCA) for receiving an input signal and producing an output signal, where the input signal is an unleveled audio program which has a wide range of average levels and the output signal is a leveled signal which contains a more constant average level, the VCA continually adjusting its gain until the average level of the output signal of the VCA equals to a reference level; (b) a leveling detector including a rectifier and a comparator, the rectifier having an input and an output, the comparator having a negative input, a positive input and an output, the positive input coupled to a reference voltage, and the negative input coupled to the output of the rectifier; (c) said rectifier receiving said output signal of said VCA at its said input and producing a rectified signal; (d) said comparator producing a pulse train containing "on" pulses and "off" pulses, where the magnitude of said rectified signal is below the magnitude of said reference voltage, said comparator produces an "off" pulse, and when the magnitude of said rectified signal is above the magnitude of said reference voltage, said comparator produces an "on" pulse; (e) an FDL control generator including a clamp and polarized differentiator (CPD) and a pulse integrator, each having an input and an output, the input of the CPD coupled to said output of said comparator, and the output of the CPD coupled to the input of the pulse generator; (f) said CPD producing a frequency dependent modified pulse train, wherein the shape of the "on" pulses is substantially modified at relatively low frequencies, but substantially unmodified at relatively high frequencies; (g) said pulse integrator converting said frequency dependent modified pulse train of said CPD into a frequency discriminate control signal which has a slower rate of rise for relatively low frequencies, but a higher rate of rise for relatively high frequencies; and (h) said output of said pulse integrator coupled to a control input of said VCA such that an increasing output voltage from said pulse integrator causes increasing gain reduction of said VCA; (i) whereby said FDL controls its attack rate depending on the audio frequency to more perfectly preserve the natural sound of the audio program while very effectively controlling the long term average program level.

Defined broadly, the present invention is a frequency discriminate leveler (FDL), comprising: (a) a voltage controlled amplifier (VCA) for receiving an input signal and producing an output signal, where the input signal is an unleveled audio program which has a wide range of average levels and the output signal is a leveled signal which has a more constant average level, the VCA continually adjusting its gain until the average level of the output signal of the VCA equals to a reference level; (b) a leveling detector including a comparator and a rectifier which is coupled between the comparator and said VCA, the rectifier receiving said output signal of said VCA and producing a rectified signal; (c) said comparator producing a pulse train containing "on" pulses and "off" pulses, where the magnitude of said rectified signal is below the magnitude of a reference voltage, said comparator produces an "off" pulse, and when the magnitude of said rectified signal is above the magnitude of the reference voltage, said comparator produces an "on" pulse; (d) an FDL control generator including a clamp and polarized differentiator (CPD) and a pulse integrator which is coupled between said VCA and the CPD, and the CPD coupled between the pulse integrator and said comparator; (e) said CPD producing a frequency dependent modified pulse train, wherein the shape of the "on" pulses is substantially modified at relatively low frequencies, but substantially unmodified at relatively high frequencies; (f) said pulse integrator converting said frequency dependent modified pulse train of said CPD into a frequency discriminate control signal which has a slower rate of rise for relatively low frequencies, but a higher rate of rise for relatively high frequencies; and (g) said pulse integrator coupled to a control input of said VCA such that an increasing output voltage from said pulse integrator causes increasing gain reduction of said VCA; (h) whereby said FDL controls its attack rate depending on the audio frequency to more perfectly preserve the natural sound of the audio program while very effectively controlling the long term average program level.

Defined more broadly, the present invention is a frequency discriminate leveler (FDL), comprising: (a) a voltage controlled amplifier (VCA) for receiving an input signal and producing an output signal, the VCA continually adjusting its gain until an average level of the output signal of the VCA equals to a reference level; (b) a leveling detector including a comparator and a rectifier which is coupled between said VCA and the comparator, the rectifier receiving said output signal of said VCA and producing a rectified signal; (c) said comparator producing a pulse train containing "on" pulses and "off" pulses, where the magnitude of said rectified signal is below the magnitude of a reference voltage, said comparator produces an "off" pulse, and when the magnitude of said rectified signal is above the magnitude of the reference voltage, said comparator produces an "on" pulse; and (d) an FDL control generator coupled between said VCA and said comparator and producing a frequency dependent modified pulse train and converting the frequency dependent modified pulse train into a frequency discriminate control signal coupled to a control input of said VCA such that an increasing output voltage from the FDL control generator causes increasing gain reduction of said VCA; (e) whereby said FDL controls its attack rate depending on the audio frequency to more perfectly preserve the natural sound of the audio program while very effectively controlling the long term average program level.

Defined even more broadly, the present invention is a frequency discriminate leveler (FDL), comprising: (a) a voltage controlled amplifier (VCA) for receiving an input signal and producing an output signal, the VCA continually adjusting its gain until an average level of the output signal of the VCA equals to a reference level; (b) a leveling detector receiving said output signal of said VCA and producing a detected signal; (c) an FDL control generator including a clamp and polarized differentiator (CPD) and a pulse integrator which is coupled between said VCA and the CPD, and the CPD coupled between the pulse integrator and said leveling detector; (d) said CPD receiving said detected signal from said leveling detector and producing a frequency dependent modified pulse train, wherein the shape of the "on" pulses is substantially modified at relatively low frequencies, but substantially unmodified at relatively high frequencies; (e) said pulse integrator converting said frequency dependent modified pulse train of said CPD into a frequency discriminate control signal which has a slower rate of rise for relatively low frequencies, but a higher rate of rise for relatively high frequencies; and (f) said pulse integrator coupled to a control input of said VCA such that an increasing output voltage from said pulse integrator causes increasing gain reduction of said VCA; (g) whereby said FDL controls its attack rate depending on the audio frequency to more perfectly preserve the natural sound of the audio program while very effectively controlling the long term average program level.

Further defined even more broadly, the present invention is a frequency discriminate leveler (FDL), comprising: (a) a gain controller for receiving an input signal and producing an output signal, the VCA continually adjusting its gain until an average level of the output signal of the VCA equals to a reference level; (b) a leveling detector for receiving said output signal of said VCA and generating a detected signal; and (c) an FDL control generator coupled between said gain controller and said leveling detector, and generating a control output for controlling said gain controller to increase or decrease in gain; (d) whereby said FDL controls its attack rate depending on the audio frequency to more perfectly preserve the natural sound of the audio program while very effectively controlling the long term average program level.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A frequency discriminate leveler (FDL), comprising:
   a. a voltage controlled amplifier (VCA) for receiving an input signal and producing an output signal, where the input signal is an unleveled audio program which has a wide range of average levels and the output signal is a leveled signal which contains a more constant average level, the VCA continually adjusting its gain until the average level of the output signal of the VCA equals to a reference level;
   b. a leveling detector including a rectifier and a comparator, the rectifier having an input and an output, the comparator having a negative input, a positive input and an output, the positive input coupled to a reference voltage, and the negative input coupled to the output of the rectifier;
   c. said rectifier receiving said output signal of said VCA at its said input and producing a rectified signal;
   d. said comparator producing a pulse train containing "on" pulses and "off" pulses, where the magnitude of said rectified signal is below the magnitude of said reference voltage, said comparator produces an "off" pulse, and when the magnitude of said rectified signal is above the magnitude of said reference voltage, said comparator produces an "on" pulse;
   e. an FDL control generator including a clamp and polarized differentiator (CPD) and a pulse integrator, each having an input and an output, the input of the CPD coupled to said output of said comparator, and the output of the CPD coupled to the input of the pulse integrator;
   f. said CPD producing a frequency dependent modified pulse train, wherein the shape of the "on" pulses is substantially modified at relatively low frequencies, but substantially unmodified at relatively high frequencies;
   g. said pulse integrator converting said frequency dependent modified pulse train of said CPD into a frequency discriminate control signal which has a slower rate of rise for relatively low frequencies, but a higher rate of rise for relatively high frequencies; and
   h. said output of said pulse integrator coupled to a control input of said VCA such that an increasing output voltage from said pulse integrator causes increasing gain reduction of said VCA;
   i. whereby said FDL controls its attack rate depending on the audio frequency to more perfectly preserve the natural sound of the audio program while very effectively controlling the long term average program level.

2. A frequency discriminate leveler (FDL), comprising:
   a. a voltage controlled amplifier (VCA) for receiving an input signal and producing an output signal, where the input signal is an unleveled audio program which has a wide range of average levels and the output signal is a leveled signal which has a more constant average level, the VCA continually adjusting its gain until the average level of the output signal of the VCA equals to a reference level;
   b. a leveling detector including a comparator and a rectifier which is coupled between the comparator and said VCA, the rectifier receiving said output signal of said VCA and producing a rectified signal;
   c. said comparator producing a pulse train containing "on" pulses and "off" pulses, where the magnitude of said rectified signal is below the magnitude of a reference voltage, said comparator produces an "off" pulse, and when the magnitude of said rectified signal is above the magnitude of the reference voltage, said comparator produces an "on" pulse;
   d. an FDL control generator including a clamp and polarized differentiator (CPD) and a pulse integrator which is coupled between said VCA and the CPD, and the CPD coupled between the pulse integrator and said comparator;
   e. said CPD producing a frequency dependent modified pulse train, wherein the shape of the "on" pulses is substantially modified at relatively low frequencies, but substantially unmodified at relatively high frequencies;
   f. said pulse integrator converting said frequency dependent modified pulse train of said CPD into a frequency discriminate control signal which has a slower rate of rise for relatively low frequencies, but a higher rate of rise for relatively high frequencies; and
   g. said pulse integrator coupled to a control input of said VCA such that an increasing output voltage from said pulse integrator causes increasing gain reduction of said VCA;
   h. whereby said FDL controls its attack rate depending on the audio frequency to more perfectly preserve the natural sound of the audio program while very effectively controlling the long term average program level.

3. The invention as defined in claim 2 wherein said comparator includes a negative input and a positive input which is coupled to said reference voltage.

4. The invention as defined in claim 2 wherein said comparator includes a positive input and a negative input which is coupled to said reference voltage.

5. A frequency discriminate leveler (FDL), comprising:
   a. a voltage controlled amplifier (VCA) for receiving an input signal and producing an output signal, the VCA continually adjusting its gain until an average level of the output signal of the VCA equals to a reference level;
   b. a leveling detector including a comparator and a rectifier which is coupled between said VCA and the comparator, the rectifier receiving said output signal of said VCA and producing a rectified signal;
   c. said comparator producing a pulse train containing "on" pulses and "off" pulses, where the magnitude of said rectified signal is below the magnitude of a reference voltage, said comparator produces an "off" pulse, and when the magnitude of said rectified signal is above the magnitude of the reference voltage, said comparator produces an "on" pulse; and
   d. an FDL control generator coupled between said VCA and said comparator and including a clamp and polarized differentiator (CPD) for producing a frequency dependent modified pulse train, and converting the frequency dependent modified pulse train into a frequency discriminate control signal coupled to a control input of said VCA such that an increasing output voltage from the FDL control generator causes increasing gain reduction of said VCA;

e. whereby said FDL controls its attack rate depending on the audio frequency to more perfectly preserve the natural sound of the audio program while very effectively controlling the long term average program level.

6. The invention as defined in claim 5 wherein said FDL control generator includes a pulse integrator.

7. A frequency discriminate leveler (FDL), comprising:

a. a voltage controlled amplifier (VCA) for receiving an input signal and producing an output signal, the VCA continually adjusting its gain until an average level of the output signal of the VCA equals to a reference level;

b. a leveling detector receiving said output signal of said VCA and producing a detected signal;

c. an FDL control generator including a clamp and polarized differentiator (CPD) and a pulse integrator which is coupled between said VCA and the CPD, and the CPD coupled between the pulse integrator and said leveling detector;

d. said CPD receiving said detected signal from said leveling detector and producing a frequency dependent modified pulse train containing "on" pulses and "off" pulses, wherein the shape of the "on" pulses is substantially modified at relatively low frequencies, but substantially unmodified at relatively high frequencies;

e. said pulse integrator converting said frequency dependent modified pulse train of said CPD into a frequency discriminate control signal which has a slower rate of rise for relatively low frequencies, but a higher rate of rise for relatively high frequencies; and f. said pulse integrator coupled to a control input of said VCA such that an increasing output voltage from said pulse integrator causes increasing gain reduction of said VCA;

g. whereby said FDL controls its attack rate depending on the audio frequency to more perfectly preserve the natural sound of the audio program while very effectively controlling the long term average program level.

8. The invention as defined in claim 7 wherein said leveling detector includes a rectifier and a comparator.

9. A frequency discriminate leveler (FDL), comprising:

a. a gain controller for receiving an input signal and producing an output signal, the gain controller continually adjusting its gain until an average level of the output signal of the gain controller equals to a reference level;

b. a leveling detector for receiving said output signal of said gain controller and generating a detected signal; and c. an FDL control generator coupled between said gain controller and said leveling detector, and including a clamp and polarized differentiator (CPD) for generating a frequency discriminate control output for controlling said gain controller to increase or decrease in gain;

d. whereby said FDL controls its attack rate depending on audio frequencies to more perfectly preserve the natural sound of an audio program while very effectively controlling a long term average program level.

10. The invention as defined in claim 9 wherein said FDL is a feedback FDL.

11. The invention as defined in claim 9 wherein said gain controller is a voltage controlled amplifier (VCA).

12. The invention as defined in claim 9 wherein said leveling detector further includes a rectifier and a comparator.

13. The invention as defined in claim 9 wherein said FDL control generator further includes a pulse integrator.

* * * * *